United States Patent [19]

Yamada et al.

[11] 3,801,383

[45] Apr. 2, 1974

[54] METHOD FOR ALIGNMENT OF DIFFUSION MASKS FOR SEMICONDUCTORS

[75] Inventors: Eiichi Yamada; Yasunobu Kosa; Eiichiro Sato, all of Tokyo, Japan

[73] Assignee: Hitachi, Ltd., Tokyo, Japan

[22] Filed: Jan. 26, 1972

[21] Appl. No.: 221,014

[30] Foreign Application Priority Data

Jan. 29, 1971 Japan .................................. 46-2825

[52] U.S. Cl. .................... 148/187, 148/188, 156/17, 317/235 R

[51] Int. Cl. ............................................ H011 7/44

[58] Field of Search .............. 148/187, 188; 156/17; 317/235

[56] References Cited

UNITED STATES PATENTS

| | | | |
|---|---|---|---|
| 3,484,309 | 12/1969 | Gilbert | 148/33.5 |
| 3,200,019 | 8/1965 | Scott, Jr. et al. | 148/188 |
| 3,404,451 | 10/1968 | So | 148/188 X |
| 3,489,622 | 1/1970 | Barson et al. | 148/188 X |
| 3,528,168 | 9/1970 | Adamic, Jr. | 148/188 UX |

*Primary Examiner*—L. Dewayne Rutledge
*Assistant Examiner*—J. M. Davis
*Attorney, Agent, or Firm*—Craig and Antonelli

[57] ABSTRACT

A method for manufacturing semiconductor devices which comprises the steps of, forming a first opening in an insulating film formed on a major surface of a silicon semiconductor substrate, forming a diffused region in the substrate by locally diffusing an impurity through the first opening in a non-oxidizing atmosphere, forming in the insulating film a second opening larger than the first opening and containing the first opening site by using the confines of the first opening as a positioning reference, forming a new insulating film covering the entire exposed surface of the substrate, and forming a third opening which is contained within the confines of the second opening by using the confines of the second opening as a positioning reference. In another example of the invention, after the formation of the second opening an exposed portion of the substrate surface is etched shallowly to form a hollow, the insulating film is entirely removed from the substrate surface, an insulating film covering the entire surface of the substrate is again provided, and then a third opening is formed in the last mentioned insulating film by using the step on the substrate surface as a positioning reference.

16 Claims, 13 Drawing Figures

METHOD FOR ALIGNMENT OF DIFFUSION MASKS FOR SEMICONDUCTORS

Figure 1A:
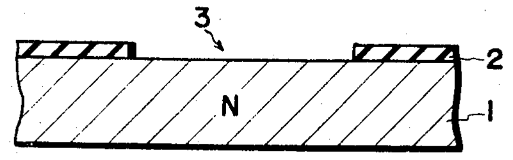

This invention relates to methods for manufacturing semiconductor devices, particularly for the mask alignment in photoetching processes.

In the manufacture of semiconductor devices such as transistors and integrated circuits, the entire surface of a semiconductor substrate is coated with an insulating film, which in the case of a silicon substrate is a thermally grown silicon oxide film. An opening is perforated in the silicon oxide film and an impurity of predetermined conductivity type is diffused through the opening into the semiconductor substrate. Over the semiconductor substrate surface within the opening a new silicon oxide film is regrown. An additional diffused region is then formed by diffusing an impurity of opposite conductivity type through an opening of smaller size perforated in the regrown silicon oxide film and electrode contacts are provided on the semiconductor regions through openings formed in the silicon oxide films. In the formation of such openings, each opening must be engraved in a proper relative position with respect to the first formed opening. Generally, the confines of the first formed opening, or the steps in the oxide films are used as a positioning reference in the photolithographic mask alignment.

However, it is sometimes desired to remove the oxide film contaminated with impurities, which served as a mask in the previous diffusion step and to eliminate the distortion caused in the substrate surface. In this case a new oxide film is formed on the exposed semiconductor surface. Or, in order to reduce stepped portions in the oxide films the first oxide film used as a diffusion mask is removed after an impurity is deposited on a selected portion of the semiconductor surface, and a new oxide film is formed on the exposed semiconductor surface during the impurity diffusion as described in U.S. Pat. No. 3,404,451. In such cases precise alignment of the photolighographic mask or stencil on the semiconductor substrate covered with photo-resist material is a critical problem since the confines of the previously formed opening are eliminated and the entire substrate surface is flat.

It is an object of the present invention to provide a new and improved method of impurity diffusion according to which a precise photolithographic mask alignment can be easily provided.

It is another object of the present invention to provide a new and improved method of manufacturing a semiconductor device in which the semiconductor substrate has little surface distortion.

It is still another object of the present invention to provide a method of providing a semiconductor device which has a novel passivation film.

In accordance with one embodiment of the present invention, an oxide film which contains a conductivity type determining impurity is provided on a surface of a semiconductor substrate within a first opening formed in a first oxide film, and the thus obtained combination is heated in a non-oxidizing atmosphere thereby forming a first diffused region in the semiconductor substrate. A second opening which is substantially larger than the first opening, and completely contains the first opening site, is perforated in the oxide film by using the confines of the first opening as a reference for positioning the photo-mask. Silicon oxide is deposited on the first oxide film and on the exposed substrate surface within the second opening to form a second oxide film, and then a third opening which is smaller than the second opening and completely within the second opening site, is formed in the second oxide film by using the confines of the second opening as a positioning reference.

In accordance with another embodiment of the present invention, a first opening is formed in a first oxide film formed on a semiconductor substrate, an oxide film containing a conductivity type determining impurity is provided so as to cover the substrate surface within the first opening, and then the resulting combination is heated in a non-oxidizing atmosphere in order to diffuse the impurity into the semiconductor substrate. A second opening which is larger than the first opening and completely contains the first opening site, is formed in the oxide film by using the confines of the first opening as a positioning reference, the exposed substrate surface within the opening is etched shallowly so as to form a hollow, and the remaining oxide film is then completely removed. A second oxide film is provided on the entire surface of the semiconductor substrate and then a third opening is formed in the second oxide film by using the confines of the hollow as a positioning reference.

Figure 1B:
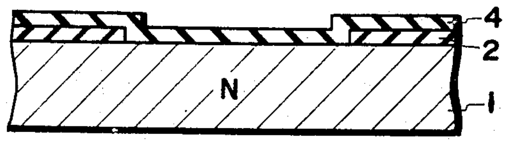
Figure 1C:
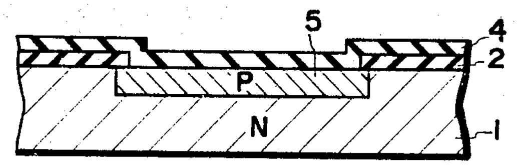
Figure 1D:
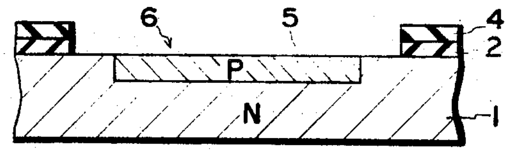
Figure 1E:
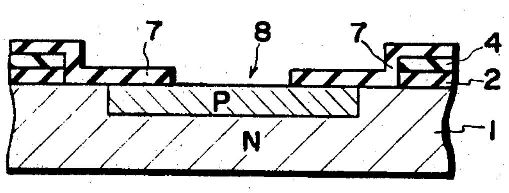
Figure 1F:
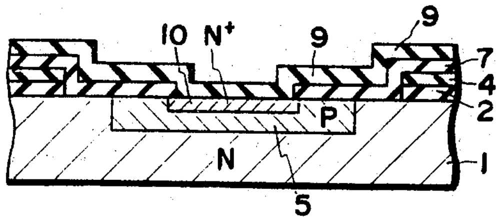
Figure 2A:
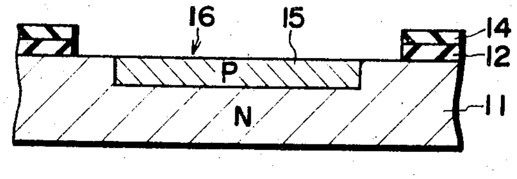
Figure 2B:
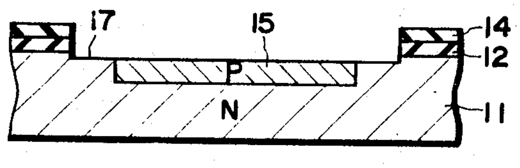
Figure 2C:
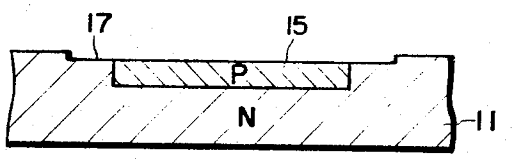
Figure 2D:
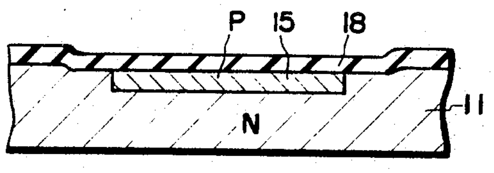
Figure 2E:
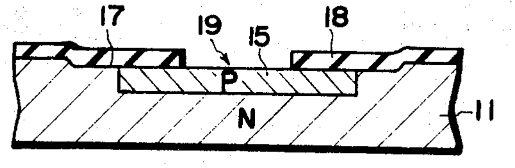
Figure 2F:
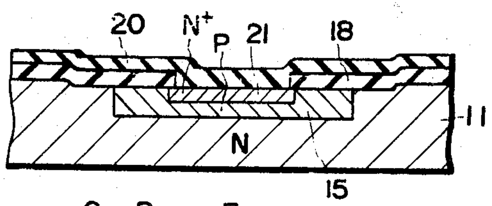
Figure 2G:
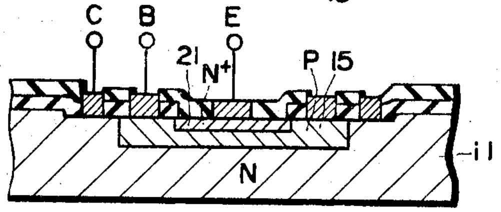

This invention will now be described with reference to the accompanying drawings in which:

FIGS. 1(*a*) through 1(*f*) are sectional views of a semiconductor wafer at various stages of the manufacture in accordance with this invention; and FIGS. 2(*a*) through 2(*g*) are sectional views of a semiconductor wafer at various stages of another embodiment in accordance with this invention.

Embodiment 1

Referring now to FIG. 1(*a*), a first opening 3 having a diameter of about 0.34 mm is photo-engraved in a silicon oxide ($SiO_2$) film 2 deposited on a major surface of an N-type silicon substrate 1 of high resistivity. The silicon oxide film 2 is formed to a thickness of about 0.6$\mu$ by heating the silicon substrate 1 in an oxygen or water vapor containing atmosphere. The silicon oxide film 2 may also be deposited on the silicon substrate 1 by the well-known chemical vapor deposition technique.

As shown in FIG. 1(*b*), a silicon oxide film 4 which contains a P-type impurity therein, for example, a mixture of silicon oxide and boron oxide is deposited to a thickness of 0.3$\mu$ over the silicon oxide film 2 and over the exposed surface portion of the silicon substrate 1 within the opening 3. The film 4 is deposited from a vapor phase by thermal decomposition of organic oxysilane slightly containing a boron compound at a temperature no less than 600°C. using an inert carrier gas of, for example, nitrogen, argon or helium. The thus obtained substrate 1 is then heated in a non-oxidizing atmosphere such as nitrogen for about 50 minutes at a temperature of about 1,200°C., whereby the boron doped in the silicon oxide film 4 is diffused into the semiconductor substrate 1 through the exposed substrate surface within the opening 3 to form a P-type diffused region 5 of 3$\mu$ thickness as shown in FIG. 1(*c*).

As shown in FIG. 1(*d*), a second opening 6 which is larger than the first opening 3 and contains the entire site of the first opening 3 is formed through the silicon oxide films 2 and 4. The second opening 6 is formed by the well-known photo-etching process. In the photoengraving process, a photo-mask for exposing photoresist coated over the wafer to light in a desired pattern is aligned over the upper surface of the substrate so that the confines of the second opening 6 are to be disposed at a certain distance $d_1$ outward from the confines of the first opening 3.

A silicon oxide film 7 is deposited to a thickness of about 0.3$\mu$ on the exposed surface of the silicon substrate 1 within the second opening 6 and on the remaining silicon oxide film 4 by the well-known chemical vapor deposition technique. Then as shown in FIG. 1(*e*), a third opening 8 which is smaller than either of the first or the second opening site is photo-engraved through the silicon oxide film 7. In the formation of the third opening 8, a photolithographic mask is provided on the photo-resist layer coated over the upper surface of the substrate 1 so that the confines of the third opening 8 are to be located at a certain distance $d_2$ inward from the confines of the second opening 6.

The next step in the manufacture is to deposit by chemical vapor deposition technique a silicon oxide film 9 which contains an N-type impurity such as phosphorus with high concentration on the entire surface of the silicon oxide film 7 and the exposed surface portion of the substrate 1 within the third opening 8. The oxide film 7 is formed by thermally decomposing organic oxysilane slightly containing a phosphorous compound in the same manner as in the formation of the boron-doped oxide film 4. The resulting combination is then heated to a temperature of about 1,050°C. for about 60 minutes in a nonoxidizing atmosphere containing nitrogen, argon or helium in order to diffuse into the silicon substrate 1 the phosphorus which is doped into the oxide film 9, whereby a heavily doped N-type diffused region 10 is formed to a thickness of about 2$\mu$ in the substrate 1 as shown in FIG. 1(*f*).

Openings are formed by the photo-etching technique in the oxide films to expose portions of the substrate surface over the diffused regions 5 and 10, respectively. In order to complete a transistor structure electronic contacts each connecting to a collector of the N-type original substrate 1, a base of the P-type diffused region 5 and an emitter of the heavily doped N-type diffused region 10 are provided at the back side of the wafer and through the last mentioned openings.

As can be seen from the foregoing explanation, since the diffusions of impurities, with which the oxide films 4 and 9 are doped into the semiconductor substrate 1, are carried out in a non-oxidizing atmosphere, the occurrence of distortion at the substrate surface interface can be reduced.

Embodiment 2

Referring now to FIG. 2(*a*), reference numerals 11, 12, 14, 15 and 16, which respectively correspond to the reference numerals 1, 2, 4, 5 and 6 in FIG. 1(*d*), designate an N-type silicon substrate of high resistivity, a silicon oxide film, a P-type impurity doped silicon oxide film, a P-type diffused region, and an opening, respectively. The combination of FIG. 2(*a*) is prepared according to the same process as shown in FIGS. 1(*a*) through 1(*d*).

A hollow 17 shown in FIG. 2(*b*) is formed by shallowly etching the exposed substrate surface portion within the opening 16 to a thickness of about 0.1$\mu$. In the etching process an etchant which etches silicon but does not etch silicon oxide, for example, a mixture of hydroflouric acid, nitric acid and acetic acid is employed, and the remaining silicon oxide films 12 and 14 act as a mask during the etching.

As shown in FIG. 2(*c*), the remaining silicon oxide films 12 and 14 are completely removed by a proper etchant which etches silicon oxide, for example, hydrofluoric acid.

The next step in the process is to form a silicon oxide film 18 of about 0.3$\mu$ on the entire exposed surface of the substrate 11 as shown in FIG. 2(*d*). The oxide film 18 is deposited by thermal oxidation of monosilane at a temperature of about 400°C. or decomposition of organic oxysilane at a temperature of from 700°C. to 800°C. using nitrogen as a carrier gas.

Referring to FIG. 2(*e*), an opening 19 is perforated in the silicon oxide film 18 by the photo-etching technique. In the formation of the third opening 19, a photolithographic mask is provided over the substrate 11 so that the confines of the third opening 19 are to be located at a certain distance $d_2$ inward from the confines of the hollow 17, or the edge line of a step on the substrate surface.

As shown in FIG. 2(*f*), a silicon oxide film 20 which contains strongly an N-type impurity is formed on the entire surface of the silicon oxide film 18 and the exposed substrate surface within the opening 19. The silicon oxide film 20 is deposited by the same method as the film 9 shown in FIG. 1(*f*). Then the resulting combination is heated in a non-oxidizing atmosphere as in the Embodiment 1 in order to diffuse the impurity into the semiconductor substrate, whereby a high concentration N-type diffused region 21 is formed.

Finally, as shown in FIG. 2(*g*) in order to complete a transistor structure, openings are formed in the silicon oxide films thereby to expose a portion of the substrate surface over each semiconductor region by the well-known photo-etching technique, and a collector electrode C, a base electrode B and an emitter electrode E of evaporated aluminum are provided.

It is to be further understood that although the invention has been specifically described for the manufacture of planar type transistors the invention may equally well be applied to the multi-diffusion processes for integrated circuits. Though silicon oxide is used in the described embodiments as a material for the insulating films, various other insulating materials such as silicon nitride and aluminum oxide may also be used. The same also applies to the substrate material which may be of any known type of semiconductor material.

What we claim is:

1. A method for manufacturing a semiconductor device comprising the steps of: forming a first opening in an insulating film formed on a semiconductor substrate, forming a first diffused region in the semiconductor substrate by locally diffusing a first conductivity type determining impurity through said first opening, then forming in the insulating film a second opening larger than the first opening and containing the entire site of said first opening, covering said second opening with another insulating film, and forming a third opening which reaches said diffused region in said other insulating film within the second opening.

2. The method according to claim 1, further comprising the steps of forming a second diffused region in the semiconductor substrate by diffusing a second conductivity type determining impurity through said third opening, and providing an ohmic contact connected to each semiconductor region.

3. The method according to claim 1, wherein the diffusion of said first conductivity type determining impurity is carried out by first depositing an insulating film which contains said first conductivity type determining impurity over the exposed surface portion of the semiconductor substrate within said first opening, and then by heating the thus obtained combination in a nonoxidizing atmosphere to diffuse the impurity contained in the insulating film into the substrate.

4. The method according to claim 1, wherein said second opening is larger than both of said first and third openings and contains the entire site of both the first and third openings.

5. The method according to claim 1, wherein said other insulating film is provided by deposition from vapor phase.

6. A method for manufacturing a semiconductor device comprising the steps of:

a. forming a first opening in an insulating film formed on a semiconductor substrate;

b. introducing a first conductivity type determining impurity into the semiconductor substrate through said first opening; then, c. forming in the insulating film a second opening larger than the first opening and containing the entire site of said first opening;

d. covering the exposed semiconductor surface in said second opening with another insulating film; and e. forming in said another insulating film within the second opening a third opening which reaches the semiconductor surface.

7. A method for manufacturing a semiconductor device comprising the steps of:

forming a first opening in an insulating film formed on a semiconductor substrate;

forming a shallow hollow in the exposed substrate surface of said substrate within said first opening;

removing the remaining insulating film from the substrate surface;

covering the substrate surface with another insulating film;

forming a second opening in said another insulating film, said confines of the hollow serving as a reference for the alignment of a photolithographic mask;

forming a diffused region in the semiconductor substrate, by diffusing a given conductivity type determining impurity through the second opening; and forming an electric contact connected to each semiconductor region.

8. A method for manufacturing a semiconductor device comprising the steps of:

forming a first opening in an insulating film formed on a semiconductor substrate;

forming a shallow hollow by etching the exposed substrate surface within the opening;

removing the remaining insulating film from the substrate surface;

covering the substrate surface with another insulating film;

forming a second opening in said other insulating film within the confines of the hollow, said confines of the hollow serving as a reference for the alignment of a photolithographic mask;

forming a diffused region in the semiconductor substrate by diffusing a given conductivity type determining impurity through the second opening; and forming an electric contact to each forming region.

9. The method according to claim 8, wherein the diffusion of said given conductivity type determining impurity is carried out by first depositing an insulating film which contains said given conductivity type determining impurity on the exposed substrate surface within the opening and then by heating the resulting combination in a non-oxidizing atmosphere.

10. A method according to claim 6, wherein said step (c) includes the step of positioning a mask for forming said second opening at a prescribed position relative to the confines of said first opening.

11. A method according to claim 6, wherein said step (e) includes the step of positioning a mask for forming said third opening at a selected position relative to an edge of said second opening.

12. A method according to claim 10, wherein said step (e) includes the step of positioning a mask for forming said third opening at a selected position relative to an edge of said second opening.

13. A method for manufacturing a semiconductor device comprising the successive steps of:

a. forming a first opening in a first insulating film formed on a semiconductor substrate of a first conductivity type, so as to expose a first surface portion of said substrate;

b. introducing a second conductivity type determining impurity into said first surface portion of said semiconductor substrate;

c. forming in said first insulating film, a second opening, which exposes at least a portion of said first surface portion of said substrate and a second surface portion of said substrate, previously covered by said first insulating film, adjacent to and contiguous with said first surface portion, an edge of said first insulating film defining an edge of said second opening and being spaced apart from said first surface portion of said substrate by said second surface portion thereof;

d. covering the surface of said substrate exposed by said second opening with a second insulating film; and e. forming, in said second insulating film, a third opening which extends to the surface of said substrate to expose a third surface portion thereof.

14. A method according to claim 13, wherein said step (c) includes the step of positioning a mask for forming said second opening at a prescribed position relative to the confines of said first opening.

15. A method according to claim 13, wherein said step (e) includes the step of positioning a mask for forming said third opening at a selected position relative to an edge of said second opening.

16. A method according to claim 14, wherein said step (e) includes the step of positioning a mask for forming said third opening at a selected position relative to an edge of said second opening.

* * * * *